(12) United States Patent
Ishikawa et al.

(10) Patent No.: US 7,214,563 B2
(45) Date of Patent: May 8, 2007

(54) IC CHIP MOUNTING METHOD

(75) Inventors: Naoki Ishikawa, Kawasaki (JP); Shunji Baba, Kawasaki (JP); Hidehiko Kira, Kawasaki (JP); Hiroshi Kobayashi, Kawasaki (JP); Shunichi Kikuchi, Kawasaki (JP); Tatsuro Tsuneno, Inagi (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 0 days.

(21) Appl. No.: 11/319,652

(22) Filed: Dec. 29, 2005

(65) Prior Publication Data

US 2007/0020800 A1 Jan. 25, 2007

(30) Foreign Application Priority Data

Jul. 20, 2005 (JP) ............... 2005-209965

(51) Int. Cl.
*H01L 21/44* (2006.01)
(52) U.S. Cl. .................. 438/106; 257/E23.001
(58) Field of Classification Search ........... 438/5–7, 438/10–11, 104, 106–114, 118, 141–123, 438/128, 129, 135, 142, 145, 149, 151, 157, 438/176, 478, 201–203, 206–211, 337, 353, 438/378, 401, 410, 184, 193, 195
See application file for complete search history.

(56) References Cited

U.S. PATENT DOCUMENTS 6,531,337 B1* 3/2003 Akram et al. ............... 438/108
6,531,338 B2* 3/2003 Akram et al. ............... 438/108
6,897,096 B2* 5/2005 Cobbley et al. ........... 438/123
2004/0115866 A1* 6/2004 Bang et al. ................. 438/125
2005/0041402 A1* 2/2005 Cady et al. ................. 361/749
2006/0084254 A1* 4/2006 Attarwala ................... 438/584

FOREIGN PATENT DOCUMENTS

| JP | 11-219962 | 8/1999 |
| JP | 2003-242472 | 8/2003 |
| WO | WO 02/091812 | 11/2002 |

OTHER PUBLICATIONS

European Search Report mailed Dec. 4, 2006 (4 pages).

* cited by examiner

*Primary Examiner*—Walter Lindsay, Jr.
*Assistant Examiner*—Andre' Stevenson
(74) *Attorney, Agent, or Firm*—Armstrong, Kratz, Quintos, Hanson & Brooks, LLP (57) ABSTRACT

An IC chip mounting method which mounts two or more IC chips on a base, includes: preparing a wafer by mounting a tape on a face thereof, which is the reverse of the wafer having a mounting surface to be attached to the base, and by dividing the wafer into IC chips by dicing while leaving the tape; positioning the wafer to face the base in such a direction that the mounting surface to be attached to the base faces the base; sequentially pressing the IC chips on the wafer against the base and temporarily fixing the IC chips while the base is being fed in a prescribed one-dimensional direction along the wafer and while the wafer is being moved two-dimensionally along the base; and fixing the IC chips temporarily fixed on the base on the base by heating and pressurizing in a batch manner.

12 Claims, 10 Drawing Sheets

IC CHIP MOUNTING METHOD

BACKGROUND OF THE INVENTION

1. Field of the Invention

The present invention relates to an IC chip mounting method for mounting two or more IC chips on a base.

2. Description of the Related Art

In recent years, various types of RFID tags have been proposed which exchange information with an external apparatus typified by a reader writer in a noncontact manner through electric waves. As one type of the RFID tags, there has been proposed a structure in which antenna patterns for radio communication and IC chips are mounted on a base sheet formed out of plastic or paper. For this type of RFID tags, there have been created usage patterns such as article identification by attaching the tag onto an article or the like and exchanging information about the article with the external apparatus.

Figure 1:
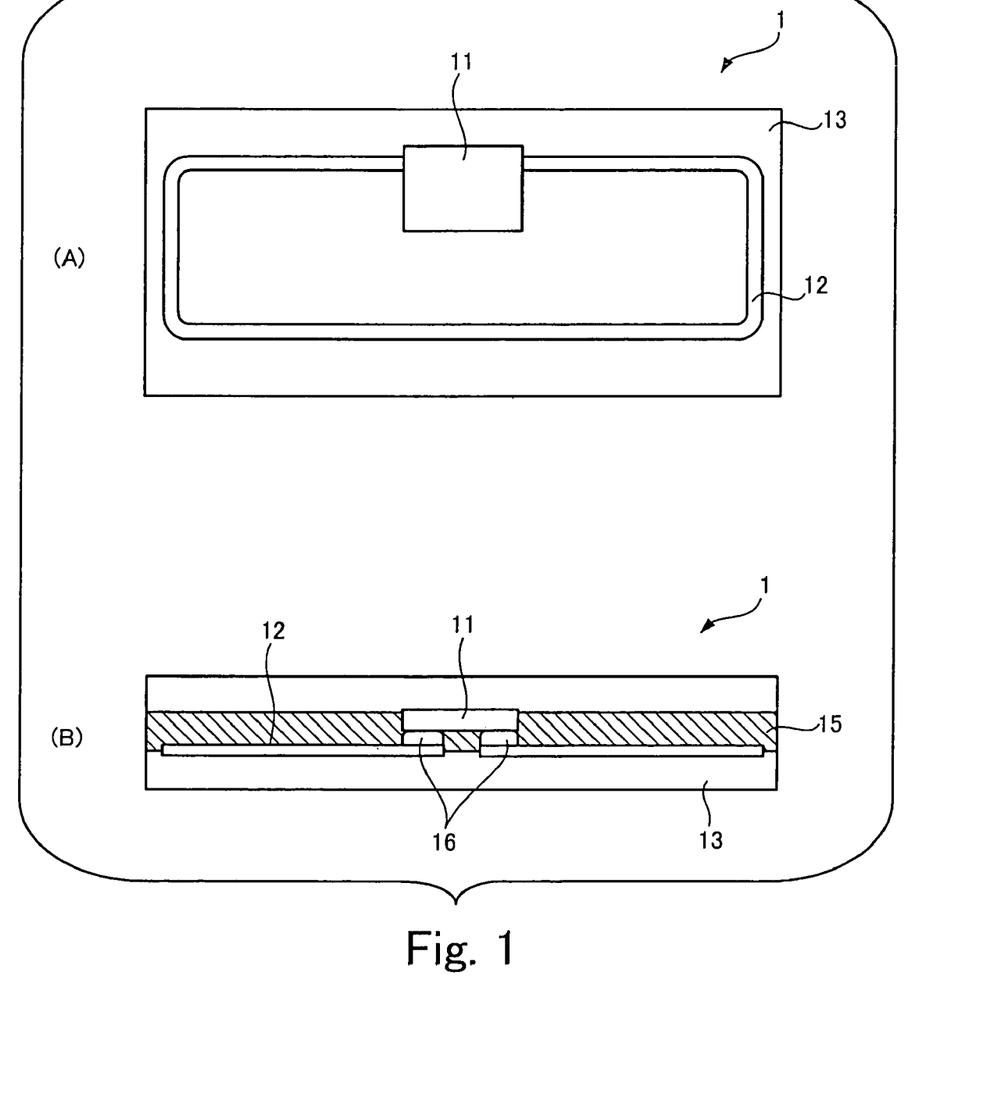
FIG. 1 is an elevational view (A) and a sectional side elevation view (B) illustrating an example of a RFID tag.

FIG. 1 is an elevational view (A) and a sectional side elevation view (B) illustrating an example of a RFID tag.

RFID tag 1 illustrated in FIG. 1 is constituted of an antenna 12 fitted onto a base 13 formed out of a sheet-like PET film or the like, an IC chip 11 connected to the antenna 12 through a bump 16 and a cover sheet 14 bonded to the base 13 using adhesives 15 with the antenna 12 and an IC chip 11 covered.

An IC chip 11 constituting the RFID tag 1 can make radio communications with an external apparatus through the antenna 12 for information exchange.

For the RFID tag, a wide range of usage patterns including the usage pattern described above have been created, however, use of the RFID tags in various types of usage patterns has a severe problem on manufacturing cost thereof, accordingly various efforts have been made for reduction in the manufacturing cost.

Figure 2:
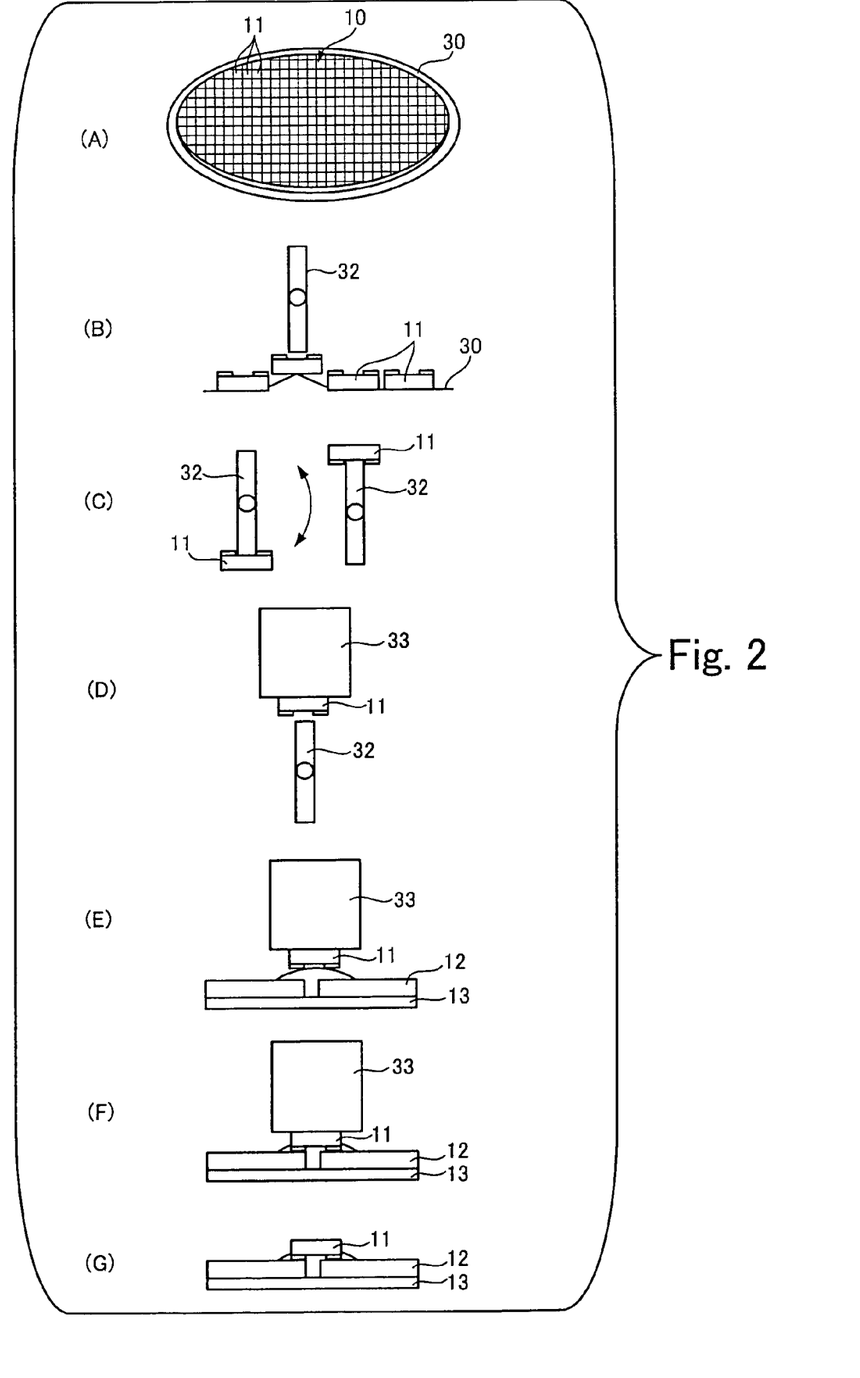
FIG. 2 is a view illustrating a general IC chip mounting method, one of conventional methods for RFID tags.

FIG. 2 is a view illustrating a general IC chip mounting method, one of conventional methods for RFID tags.

As illustrated in part (A) of FIG. 2, the whole surface of a back side (the other face of a wafer having a mounting surface to be attached to a base sheet) of a wafer 10 built out of various types of IC chips is mounted with a tape 30 and further divided into IC chips 11 leaving the tape 30 by dicing.

As illustrated in part (B) of FIG. 2, one of a large amount of IC chips 11 on the wafer 10 is pulled and taken off from the tape 30 and held up using a picking jig 32.

As illustrated in part (C) of FIG. 2, the picking jig 32 with the IC chip 11 sucked is turned upside down.

As illustrated in part (D) of FIG. 2, the IC chip 11 is transferred onto a bonding head 33.

Furthermore, as illustrated in part (E) of FIG. 2, the bonding head 33 carries the IC chip 11 onto the base 13, places the chip on a proper position connected to the antenna 12 formed on the base 13 and, as illustrated in part (F) of FIG. 2, solders the IC chip 11 onto the base 13 by pressurizing and heating. When the bonding head 33 is then moved from the IC chip 11, IC chip 11 mounting is completed as illustrated in part (G) of FIG. 2.

Respective processes illustrated in parts (B) to (G) of FIG. 2 are sequentially repeated for a large amount of IC chips 11 on the wafer 10.

However, this mounting method requires to sequentially perform, for each IC chip, a complicated process that the IC chips 11 on the wafer 10 are picked up one by one, inverted, delivered to another jig (bonding head) and mounted at the bonding head, thus impairing productivity and increasing manufacturing cost.

As one method for reducing the manufacturing cost, Japanese Patent Laid-Open No. 2003-242472 has proposed that recessed portions for embedding IC chips are formed at intervals on a traveling web material (base), the IC chips are fitted into the recessed portions and antenna patterns are printed by means of an ink jet method so as to be connected with the IC chips fitted into the recessed portions.

However, the method proposed by Japanese Patent Laid-Open No. 2003-242472 includes filling a tank with liquid to float the IC chips in the liquid and traveling the web material (base) through the tank inside to fit the IC chips into the recessed portions on the web material (base) in mounting the IC chips into the recessed portions on the web material (base). The conventional method has a problem of low process reliability of fitting the IC chips into the recessed portions because the IC chips are not always fitted exactly into the recessed portions in a proper direction and the recesses having no IC chips therein may pass through the tank inside. Even if the IC chips are properly fitted into the recessed portion, the antenna pattern needs to be positioned with high accuracy relative to the IC chips fitted into the recessed portions. Moreover, if a negligible error occurs at a position where the IC chips are fitted into the recessed portions, a printing position of the antenna pattern needs to be changed according to the error, which may not yield high productivity.

SUMMARY OF THE INVENTION

The present invention has been made in view of the above circumstances and provides an IC chip mounting method capable of achieving high productivity.

The first aspect of IC chip mounting methods of the present invention is an IC chip mounting method for mounting two or more IC chips on a base, including the steps of:

preparing a wafer by mounting a tape on a face thereof, which is the reverse of the wafer having a mounting surface to be attached to the base, and by dividing the wafer into IC chips by dicing while leaving the tape;

positioning the wafer to face the base in such a direction that the mounting surface to be attached to the base faces the base;

sequentially pressing the IC chips on the wafer against the base and temporarily fixing the IC chips while the base is being fed in a prescribed one-dimensional direction along the wafer and while the wafer is being moved two-dimensionally along the base; and fixing the IC chips temporarily fixed on the base on the base by heating and pressurizing in a batch manner.

The second aspect of IC chip mounting methods of the present invention is an IC chip mounting method for mounting two or more IC chips on a base, including the steps of:

preparing a wafer by mounting a tape on a face thereof, which is the reverse of the wafer having a mounting surface to be attached to the base, and by dividing the wafer into IC chips by dicing while leaving the tape;

positioning the wafer to face the base in such a direction that the mounting surface to be attached to the base faces the base; and sequentially fixing the IC chips on the base by pressing the IC chips on the wafer against the base for heating and pressurizing with a heating and pressurizing head which performs heating and pressurizing while the base is being fed in a prescribed one-dimensional direction along the wafer and while the wafer is being moved two-dimensionally along the base.

The third aspect of IC chip mounting methods of the present invention is an IC chip mounting method for mounting two or more IC chips on a base, including the steps of:

mounting a tape on a face of a wafer before the wafer is divided into IC chips by dicing, the face being the reverse of the wafer having a mounting surface to be attached to the base, and the tape being contracted by folding so that intervals between the IC chips may meet intervals between mounting positions of the IC chips onto the base by development after the dicing, dividing the wafer mounted with the contracted tape into IC chips by dicing while leaving the tape; and positioning the IC chip mounted with the tape to face the base under a developed state of the tape in such a direction that the mounting surface of the IC chip to the base faces the base; and mounting the IC chip on the base.

The fourth aspect of IC chip mounting methods of the present invention is an IC chip mounting method for mounting two or more IC chips on a base, including the steps of:

preparing a wafer by mounting a tape on a face, which is the reverse of the wafer having a mounting surface to be attached to the base, and by dividing the wafer into IC chips by dicing while leaving the tape, and contracting the base to be mounted with the IC chips by folding so that intervals between mounting positions of the IC chips on the base may be the same as prescribed intervals between mounting positions of the IC chips on the base by mounting the IC chips positioned on the wafer on the base and developing the base;

positioning the wafer mounted with the tape to face the contracted base in such a direction that the mounting surface to be attached to the base faces the base;

mounting the IC chips on the wafer on the contarcted base; and developing the base.

In any one of the first to fourth IC chip mounting methods of the present invention, it is preferable that the base is formed with two or more antennas for communication provided at prescribed intervals and each of the IC chips is mounted with a circuit for performing radio communication through each of the antennas positioned on the base. In other words, preferably, the present invention is applied to RFID tags.

In any one of the first to fourth IC chip mounting methods of the present invention, it is preferable that mounting positions of the IC chips on the base and/or the IC chips themselves are shot with a camera and the IC chips are mounted on the base while position adjustment being made by image recognition.

The first and the second IC chip mounting methods of the present invention respectively permit the IC chips to be sequentially mounted on the base at a high speed, thus enhancing productivity of IC chip mounting.

Moreover, the third and the fourth IC chip mounting methods respectively permit two or more IC chips to be mounted on the base at a time or at a high speed sequentially because the IC chips are mounted on the base with intervals of the IC chips meeting intervals of mounting positions of the IC chips on the base, thus enhancing productivity of IC chip mounting.

DETAILED DESCRIPTION OF THE INVENTION

Embodiments of the present invention will be described below.

Figure 3:
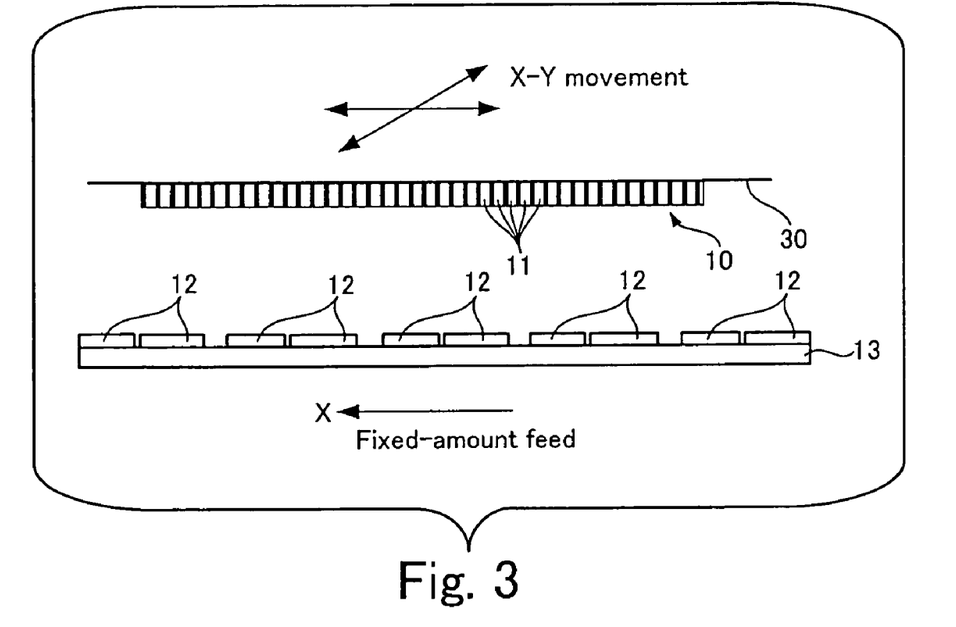
FIG. 3 is a view illustrating a relationship between a wafer and a base.

FIG. 3 is a view illustrating a relationship between a wafer and a base.

In the first embodiment described below, the wafer 10 and the base 13 are prepared and are disposed at such positions that the wafer 10 and the base 13 face each other as illustrated in FIG. 3. The wafer 10 is divided into IC chips 11 by amounting a tape on a face (top face in FIG. 3) thereof which is the reverse of the wafer having a mounting surface (bottom face in FIG. 3) to be attached to the base 13, and leaving the tape 30 by dicing. The wafer 10, as illustrated in FIG. 3, is disposed at a position facing the base 13, in such a direction that the mounting surface to be attached to the base 13 faces the base 13. The wafer 10 is two-dimensionally moved in X and Y directions along the base 13.

The base 13 is formed with two or more antennas 12 at prescribed intervals provided on a face (top face in FIG. 3) on the side facing the wafer 10 and is fed by a fixed amount in such a direction (indicated by arrow X in FIG. 3) that the antennas 12 align.

In the first embodiment of the present invention, the wafer 10 and the base 13 are disposed as illustrated in FIG. 3 and the IC chips 11 on the wafer 10 are mounted on the base 13 in the following way.

Figure 4:
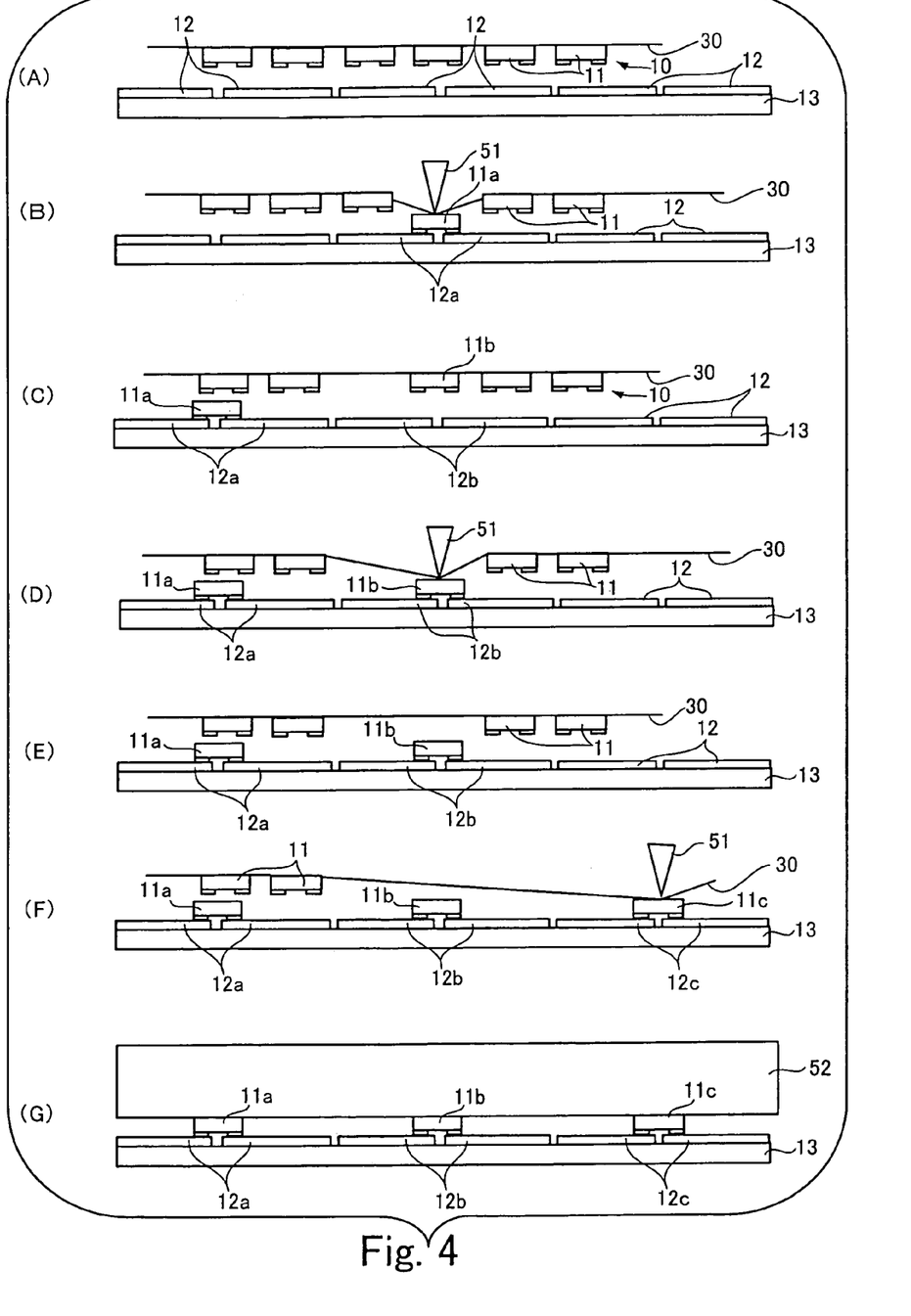
FIG. 4 is a process diagram illustrating an IC chip mounting method according to the first embodiment of the present invention.

FIG. 4 is a process diagram illustrating an IC chip mounting method according to the first embodiment of the present invention.

As described in reference to FIG. 3, first, the wafer 10 mounted with the tape 30 and divided into IC chips 11 is prepared for and is disposed facing the base 13 in such a direction that a mounting surface to the base 13 faces the base 13. On the other hand, the antennas 12 are arranged on the base 13 (part (A) of FIG. 4).

By two-dimensionally moving the wafer 10 in X and Y directions (refer to FIG. 3) under such a condition that while the base 13 is being fed by a fixed amount in a direction of an arrow X (refer to FIG. 3), one (IC chip 11a) of a large amount of IC chips 11 aligning on the wafer 10 is pressed from the top of the tape 30 with a press-against jig 51 and the IC chip 11a is temporarily fixed on one antenna 12a positioned on the base 13 (part (B) of FIG. 4).

Figure 5:
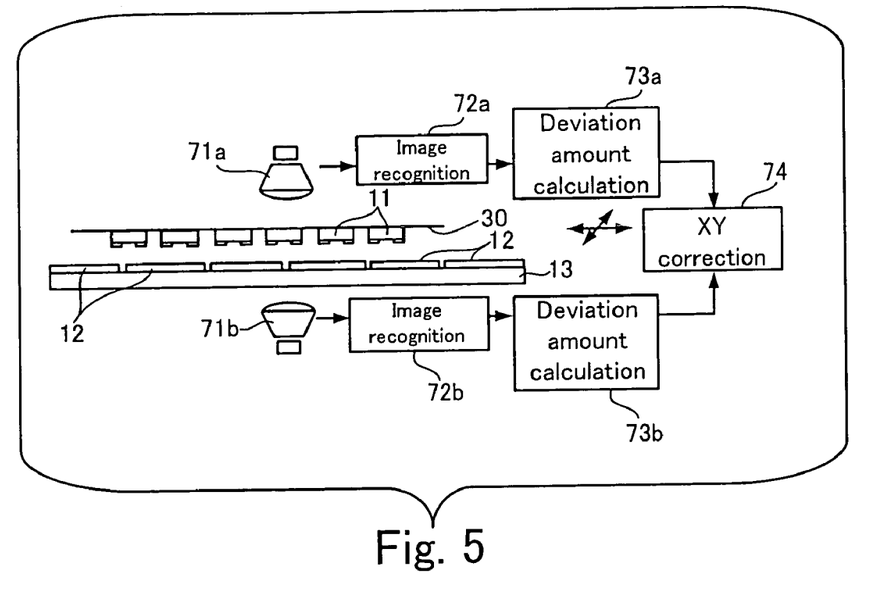
FIG. 5 is a diagram showing a scene where IC chips are mounted on a base.

FIG. 5 is a diagram showing a scene where IC chips 11 are positioned on the base 13.

In temporarily fixing the IC chips 11 on the base 13 by pressing each of the IC chips 11 with the press-against jig 51, the IC chip 11 to be temporarily fixed is necessary to position at a prescribed position on the base 13. The IC chip 11 itself to be mounted and a mounting position of the IC chip 11 on the base 13 are shot with two cameras 71a, 71b and images thereof are recognized by respective image recognition sections 72a, 72b, respective deviation amounts are calculated by respective deviation amount calculation sections 73a, 73b. An XY correction section 74 exactly positions the IC chip to be mounted at a prescribed position on the base 13 by totalizing their deviation amounts. This permits the IC chip 11 to be exactly mounted at a prescribed position relative to the antenna 12 on the base 13.

The description of this embodiment will be made, returning to FIG. 4.

Next, the wafer 10 is positioned by X-Y movement during feeding of the base 13 by a fixed amount (part (C) of FIG. 4), and the next IC chip 11b is pressed by the press-against jig 51 (part (D) of FIG. 4) and is temporarily fixed on the next antenna 12b positioned on the base 13 (part (E) of FIG. 4).

Next, the IC chip 11c is pressed against the antenna 12c positioned on the base 13 with the press-against jig 51 (part (F) of FIG. 4) in the same way and is temporarily fixed on the antenna 12c.

After the IC chips 11 are temporarily fixed on the antennas 12 positioned on the base 13 respectively in this way, a batch heating head 52 is placed on the IC chips 11, so that the IC chips 11 are heated and pressurized and solder-mounted on the respective antennas 12 positioned on the base 13 in a batch manner (part (G) of FIG. 4).

The first embodiment permits two or more IC chips 11 to be temporarily fixed on the base 13 sequentially at a high speed and the IC chips 11 temporarily fixed on the base 13 to be solder-fixed in a batch manner by the batch heating head 52, thus accelerating mounting of the IC chips 11 on the base 13 for high productivity.

Figure 6:
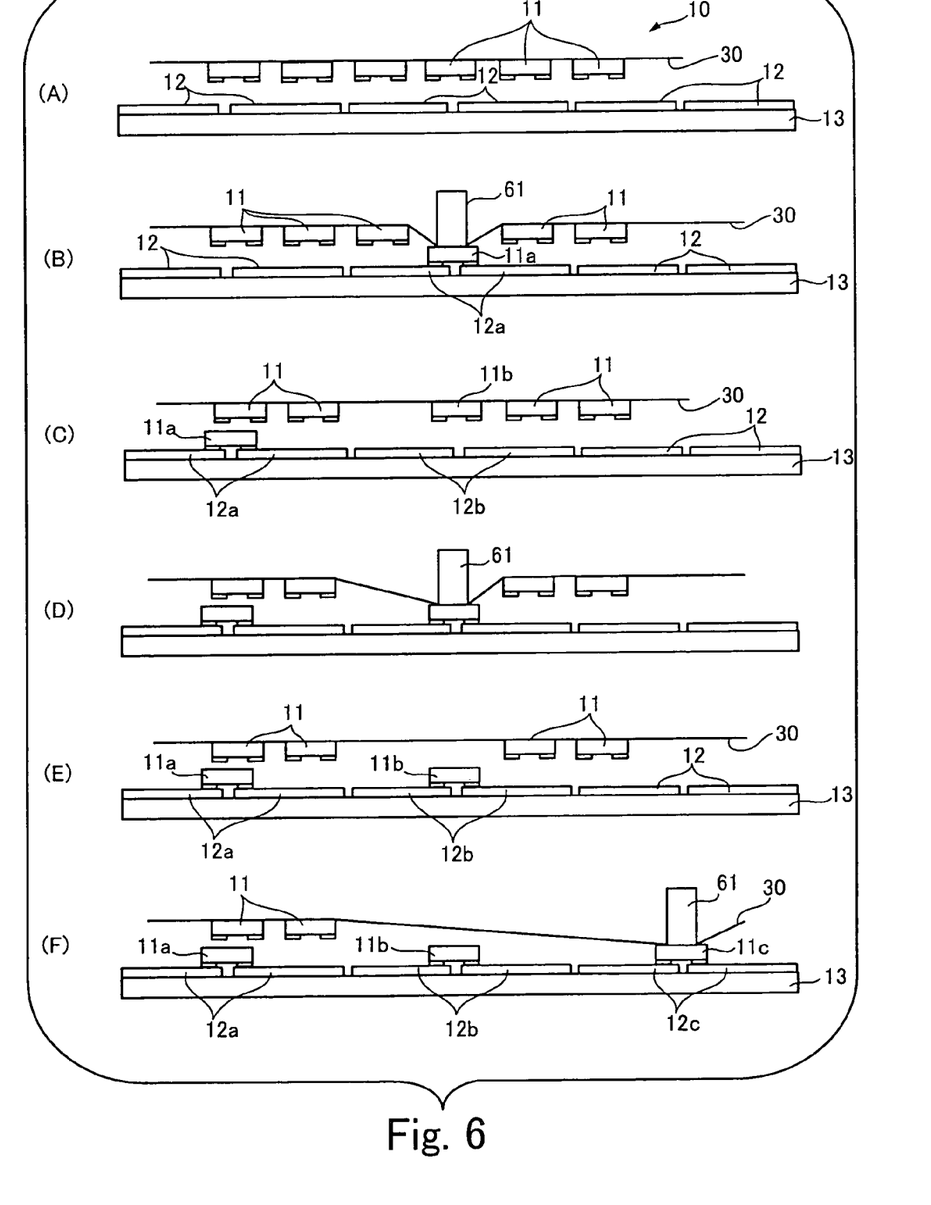
FIG. 6 is a process diagram illustrating an IC chip mounting method according to the second embodiment of the present invention.

FIG. 6 is a process diagram illustrating an IC chip mounting method according to the second embodiment of the present invention.

The second embodiment uses the forms of arrangement and movement described referring to FIG. 3, which is left as it is. In other words, as illustrated in FIG. 3, first, the wafer 10 mounted with the tape 30 and divided into IC chips 11 is prepared and is disposed so as to face the base 13 in such a direction that the mounting surface to be attached to the base 13 faces the base 13. On the other hand, the antennas 12 are arranged on the base 13 (part (A) of FIG. 6).

By two-dimensionally moving the wafer 10 in X and Y directions (refer to FIG. 3) under such a condition that while the base 13 is being fed by a fixed amount in a direction of an arrow X (refer to FIG. 3), one (IC chip 11a) of a large amount of IC chips 11 aligning on the wafer 10 is pressed from the top of the tape 30 with a heating head 61 for heating and pressurizing, and the IC chip 11a is soldered onto one antenna 12a positioned on the base 13 (part (B) of FIG. 6).

Figure 7:
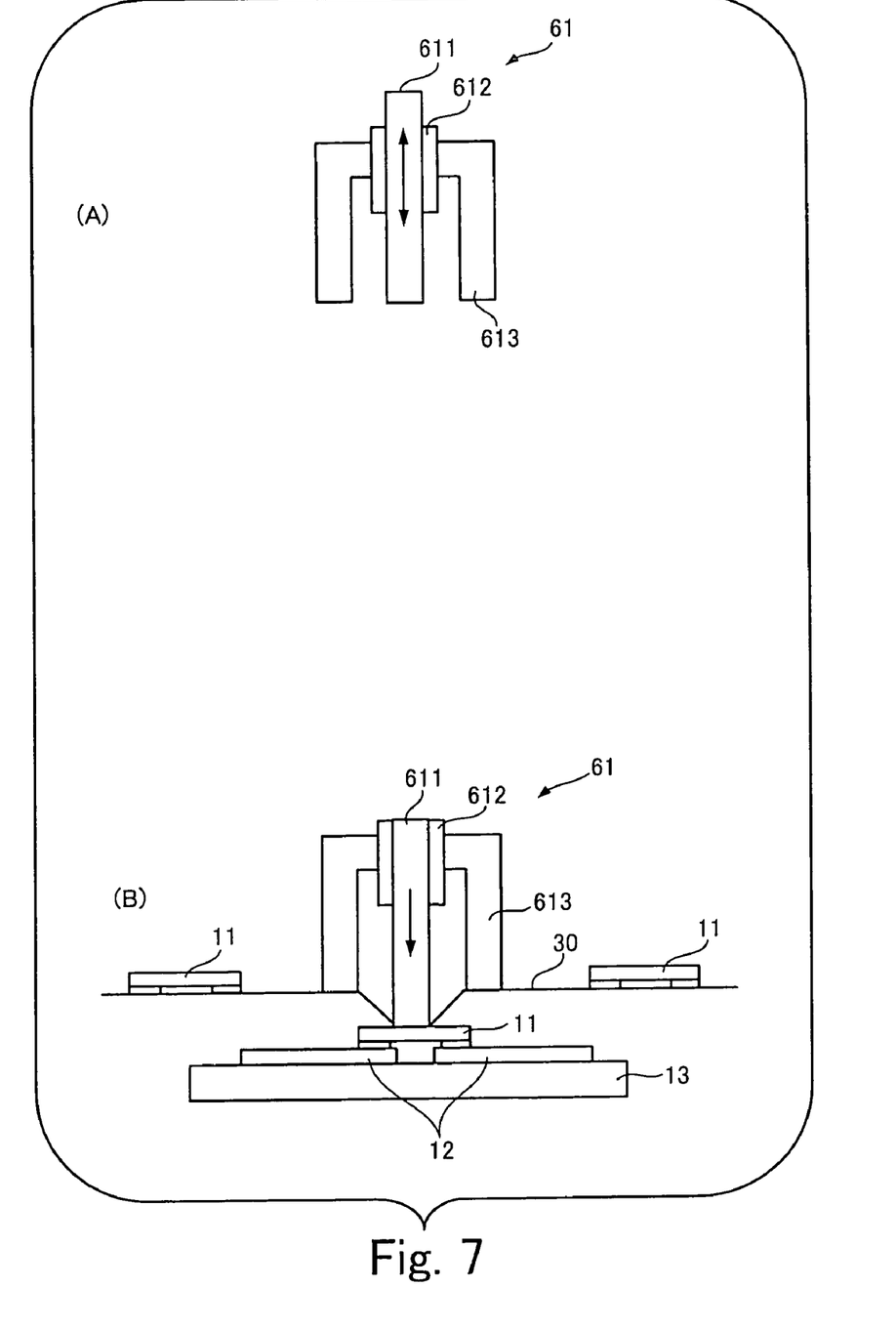
FIG. 7 is a diagram showing a structure of a heating head.

FIG. 7 is a diagram showing a structure of the heating head 61.

The heating head 61 includes a mounting head 611 at the central portion thereof. The mounting head 611 has a heater (not illustrated) therein and is so structured as to move vertically, retained by a head retainer 612. A sucking section 613 is provided so as to surround the mounting head 611. The sucking section 613 is sucked onto a periphery of the pressed-down IC chip 11 when the IC chip 11 is pressed down from the top of the tape 30 with the mounting head 611 as illustrated in part (B) of FIG. 7, so as to prevent an effect of the mounting head 611 pressing down the IC chip 11 to be pressed down from being exerted on a portion of the IC chip adjacent to the tape 30. This is because the effect exerted on the portion of the adjacent IC chip may cause an elongation of the tape to the portion of the adjacent IC chip to appear as a mounting position error at the time of mounting the IC chip.

A description of this embodiment will be made, returning to FIG. 6.

Next, the wafer 10 side is positioned by X-Y movement during feeding of the base 13 by a fixed amount (part (C) of FIG. 6), and the next IC chip 11b is pressed by the heating head 61 (part (D) of FIG. 6) and is soldered onto the next antenna 12b positioned on the base 13 (part (E) of FIG. 6).

Next, the IC chip 11c is pressed against the antenna 12c positioned on the base 13 for heating and pressuring by the heating head 61 (part (F) of FIG. 6) in the same way and is soldered onto the antenna 12c.

In this way, the second embodiment provides sequential and high-speed soldering of two or more IC chips 11 onto the two or more antennas 12 positioned on the base 13 respectively while the base 13 is delivered by a fixed amount and the wafer 10 is making X-Y movement, thus accelerating mounting of the IC chips 11 for high productivity.

Figure 8:
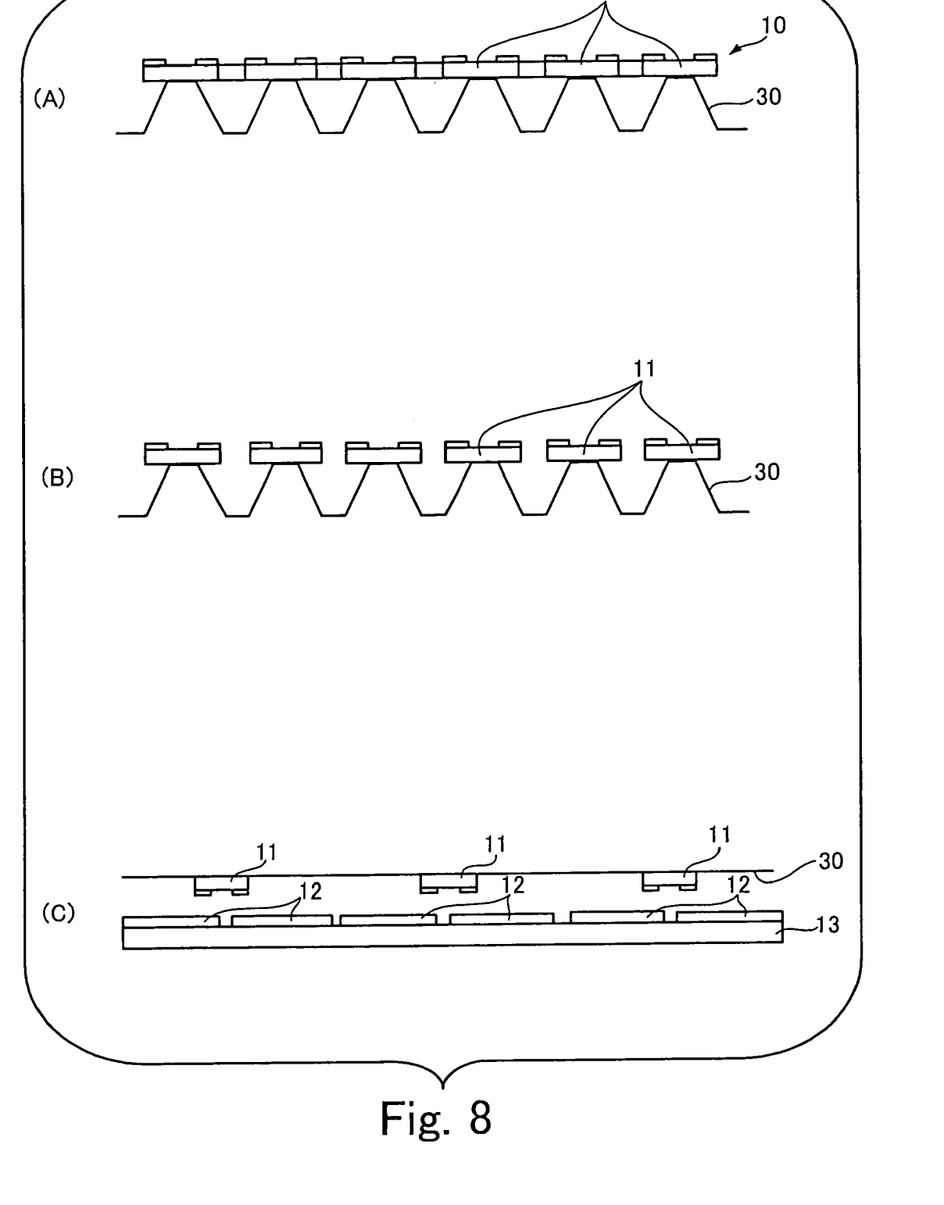
FIG. 8 is a process diagram illustrating the third embodiment of the present invention.

FIG. 8 is a process diagram illustrating the third embodiment of the present invention.

A face (top face in part (A) of FIG. 8) of the wafer 10 before being divided into two or more IC chips 11, which is the reverse of the wafer 10 having the mounting surface (bottom face in part (A) of FIG. 8) to be attached to the base 13 (refer to part (C) of FIG. 8), is mounted with the tape 30 (part (A) of FIG. 8). The tape 30 is in a contracted state by folding so that intervals between the IC chips 11 may meet intervals between mounting positions of the IC chips on the base 13 by development after dicing.

Mounting the IC chips with the tape 30 contracting the wafer 10 is accomplished after positioning is performed so that each of top sections as ridges of folded sections of the tape 30 may meet each of the IC chips 11.

Subsequently, the wafer 10 is diced so as to be divided into IC chips 11 (part (B) of FIG. 8).

The IC chip 11 mounted with the tape 30 is made to face the base 13 in such a direction that the mounting surface (bottom face in part (C) of FIG. 8) of the IC chip 11 to the base 13 faces the base 13 under a developed state of the tape 30 (part (C) of FIG. 8).

Under this state, intervals between the IC chips 11 and intervals between the antennas 12 on the base 13 meet each other, thus eliminating need for individual positioning. Otherwise, even in the case of individual positioning as illustrated in FIG. 5, positioning may be slightly adjusted and the IC chips 11 may be fixed onto the respective antennas 12 on the base 13 in a batch manner or sequentially at a high speed.

Figure 9:
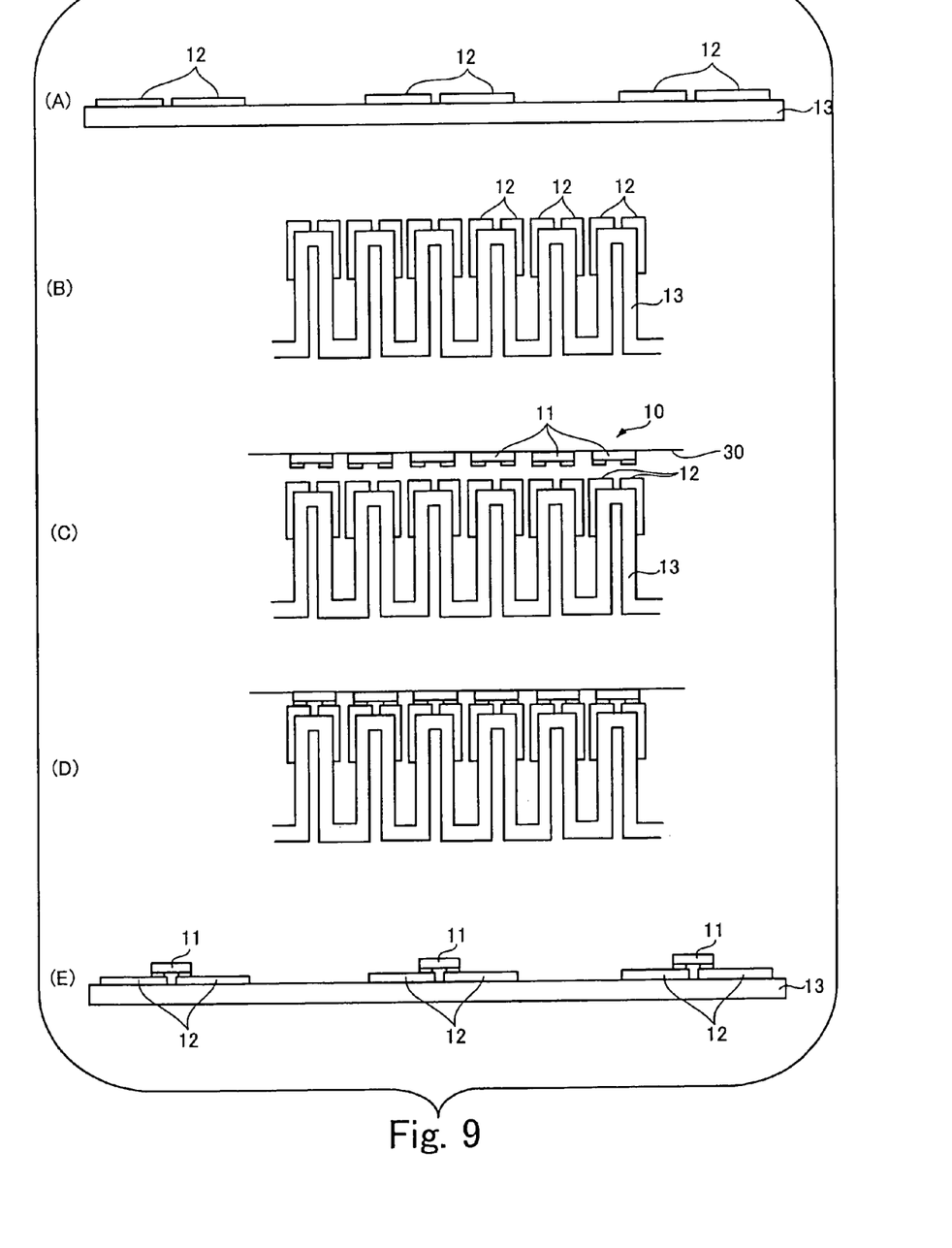
FIG. 9 is a process diagram illustrating the fourth embodiment of the present invention.

FIG. 9 is a process diagram illustrating the fourth embodiment of the present invention.

The base 13 formed with the antennas 12 provided at equal intervals as illustrated in part (A) of FIG. 9 is contracted by folding as illustrated in part (B) of FIG. 9. The base 13 is mounted with IC chips 11 positioned on the wafer 10 on the base 13 by folding processing to develop the base 13, so that the base 13 is contracted in such a manner that intervals between the IC chips positioned on the base 13 may be equal to prescribed intervals between mounting positions of the IC chips 11 on the base 13, that is, intervals between the antennas 12.

In addition to the base, the wafer 10 is prepared such that a face of the wafer 10, which is the other side of the wafer 10 having a mounting surface to be attached to the base 13, is mounted with the tape 30; and the wafer is divided into IC chips 11 by dicing while leaving the tape 30. The wafer 10 is made to face the base 13 contracted in the above way in such a direction that the mounting surface to be attached to the base 13 faces the base 13 (part (C) of FIG. 9), and the IC chips 11 are mounted on the respective antennas 12 positioned on the base 113 (part (D) of FIG. 9). Then, when the base 13 is developed, the IC chips 11 are mounted one by one on each of the antennas 12 formed on the base 13 at prescribed intervals (part (E) of FIG. 9).

Figure 10:
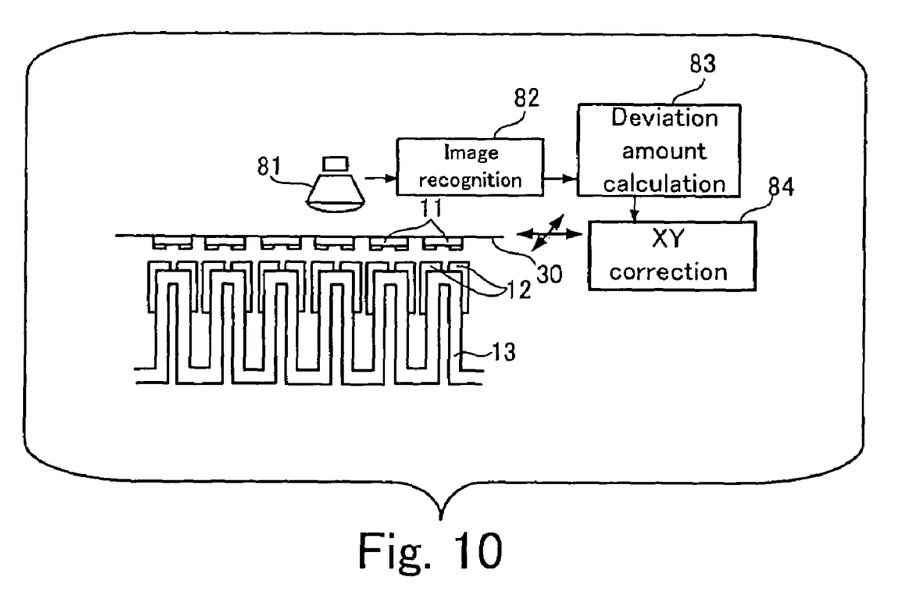
FIG. 10 is a diagram showing a scene where IC chips are mounted on a base.

FIG. 10 is a diagram showing a scene where the IC chips 11 are mounted on the base 13.

In mounting the IC chips 11 on the base 13, a mounting portion of each of the IC chips is shot with a camera 81, an image thereof is recognized by an image recognition section 82, a deviation of the IC chip 11 from the antenna 12 on the base 13 is calculated by a deviation calculation section 83, and positioning of the IC chip 11 is adjusted by an XY correction section 84. This permits the IC chip 11 to be exactly mounted at a prescribed position relative to the antenna 12 on the base 13.

The fourth embodiment provides mounting of the two or more IC chips 11 on the base 13 in a batch or sequentially at a high speed, thus accelerating IC chip mounting for mounting cost reduction.

What is claimed is:

1. An IC chip mounting method which mounts two or more IC chips on a base, comprising the steps of:
   preparing a wafer by mounting a tape on a face thereof, which is the reverse of the wafer having a mounting surface to be attached to the base, and by dividing the wafer into IC chips by dicing while leaving the tape;
   positioning the wafer to face the base in such a direction that the mounting surface to be attached to the base faces the base;
   sequentially pressing the IC chips on the wafer against the base and temporarily fixing the IC chips while the base is being fed in a prescribed one-dimensional direction along the wafer and while the wafer is being moved two-dimensionally along the base; and
   fixing the IC chips temporarily fixed on the base on the base by heating and pressurizing in a batch manner.

2. An IC chip mounting method which mounts two or more IC chips on a base, comprising the steps of:
   preparing a wafer by mounting a tape on a face thereof, which is the reverse of the wafer having a mounting surface to be attached to the base, and by dividing the wafer into IC chips by dicing while leaving the tape;
   positioning the wafer to face the base in such a direction that the mounting surface to be attached to the base faces the base; and
   sequentially fixing the IC chips on the base by pressing the IC chips on the wafer against the base for heating and pressurizing with a heating and pressurizing head which performs heating and pressurizing while the base is being fed in a prescribed one-dimensional direction along the wafer and while the wafer is being moved two-dimensionally along the base.

3. An IC chip mounting method which mounts two or more IC chips on a base, comprising the steps of:
   mounting a tape on a face of a wafer before the wafer is divided into IC chips by dicing, the face being the reverse of the wafer having a mounting surface to be attached to the base, and the tape being contracted by folding so that intervals between the IC chips may meet intervals between mounting positions of the IC chips onto the base by development after the dicing,
   dividing the wafer mounted with the contracted tape into IC chips by dicing while leaving the tape; and
   positioning the IC chip mounted with the tape to face the base under a developed state of the tape in such a direction that the mounting surface of the IC chip to the base faces the base; and
   mounting the IC chip on the base.

4. An IC chip mounting method which mounts two or more IC chips on a base, comprising the steps of:
   preparing a wafer by mounting a tape on a face, which is the reverse of the wafer having a mounting surface to be attached to the base, and by dividing the wafer into IC chips by dicing while leaving the tape, and contracting the base to be mounted with the IC chips by folding so that intervals between mounting positions of the IC chips on the base may be the same as prescribed intervals between mounting positions of the IC chips on the base by mounting the IC chips positioned on the wafer on the base and developing the base;
   positioning the wafer mounted with the tape to face the contracted base in such a direction that the mounting surface to be attached to the base faces the base;
   mounting the IC chips on the wafer on the contarcted base; and
   developing the base.

5. An IC chip mounting method according to claim 1, wherein the base is formed with two or more antennas for communication provided at prescribed intervals, and
   each of the IC chips is mounted with a circuit which performs radio communication through each of the antennas positioned on the base.

6. An IC chip mounting method according to claim 2, wherein the base is formed with two or more antennas for communication provided at prescribed intervals, and
   each of the IC chips is mounted with a circuit which performs radio communication through each of the antennas positioned on the base.

7. An IC chip mounting method according to claim 3, wherein the base is formed with two or more antennas for communication provided at prescribed intervals, and
   each of the IC chips is mounted with a circuit which performs radio communication through each of the antennas positioned on the base.

8. An IC chip mounting method according to claim 4, wherein the base is formed with two or more antennas for communication provided at prescribed intervals, and
   each of the IC chips is mounted with a circuit which performs radio communication through each of the antennas positioned on the base.

9. An IC chip mounting method according to claim 1, wherein mounting positions of the IC chips on the base and/or the IC chips themselves are shot with a camera and the IC chips are mounted on the base while position adjustment being made by image recognition, in mounting the IC chips facing the base on the base.

10. An IC chip mounting method according to claim 2, wherein mounting positions of the IC chips on the base and/or the IC chips themselves are shot with a camera and the IC chips are mounted on the base while position adjustment being made by image recognition, in mounting the IC chips facing the base on the base.

11. An IC chip mounting method according to claim 3, wherein mounting positions of the IC chips on the base and/or the IC chips themselves are shot with a camera and the IC chips are mounted on the base while position adjustment being made by image recognition, in mounting the IC chips facing the base on the base.

12. An IC chip mounting method according to claim 4, wherein mounting positions of the IC chips on the base and/or the IC chips themselves are shot with a camera and the IC chips are mounted on the base while position adjustment being made by image recognition, in mounting the IC chips facing the base on the base.

\* \* \* \* \*